(12) United States Patent
Jaeschke et al.

(10) Patent No.: US 11,984,848 B2
(45) Date of Patent: May 14, 2024

(54) FREQUENCY GENERATOR ARRANGEMENT (71) Applicant: 2pi-Labs GmbH, Bochum (DE)

(72) Inventors: Timo Jaeschke, Hattingen (DE); Simon Kueppers, Bochum (DE)

(73) Assignee: 2pi-Labs GmbH, Bochum (DE)

( * ) Notice: Subject to any disclaimer, the term of this patent is extended or adjusted under 35 U.S.C. 154(b) by 351 days.

(21) Appl. No.: 17/310,225

(22) PCT Filed: Feb. 4, 2021

(86) PCT No.: PCT/EP2021/052639
§ 371 (c)(1),
(2) Date: Jul. 27, 2021

(87) PCT Pub. No.: WO2021/156353
PCT Pub. Date: Aug. 12, 2021

(65) Prior Publication Data
US 2022/0278649 A1    Sep. 1, 2022

(30) Foreign Application Priority Data

Feb. 7, 2020  (EP) .................................. 20156186
Jun. 30, 2020 (EP) .................................. 20183279

(51) Int. Cl.
  *H03B 19/14*     (2006.01)
  *G01S 7/40*      (2006.01)
  (Continued)

(52) U.S. Cl.
  CPC ............ *H03B 19/14* (2013.01); *G01S 7/4013* (2021.05); *H03B 1/02* (2013.01); *H03C 1/36* (2013.01);
  (Continued)

(58) Field of Classification Search
  CPC .... H03B 19/14; H03B 1/02; H03B 2201/038; H03C 1/36; G01S 7/4013; H03K 7/08
  (Continued)

(56) References Cited

U.S. PATENT DOCUMENTS 3,808,539 A    4/1974   Martin
2014/0139274 A1 5/2014  Lee et al.
  (Continued)

FOREIGN PATENT DOCUMENTS

DE    102014112806 A1    3/2016

OTHER PUBLICATIONS

Morgan, Matthew et al. "A MMIC-Based 75-10 GHZ Signal Source" 2002 IEEE MTT-S International Microwave Symposium Digest (Cat. No. 02CH37278), Seattle, WA, USA, 2002, pp. 1859-1862 vol. 3. doi: 10.1109/MWSYM.2002.1012225.
(Continued)

*Primary Examiner* — Arnold M Kinkead
(74) *Attorney, Agent, or Firm* — Jason H. Vick; Sheridan Ross, PC (57) ABSTRACT

The present invention relates to a frequency generator arrangement having an oscillator for generating an oscillator signal having an oscillator frequency and an oscillator output for outputting the oscillator signal, the frequency generator arrangement further comprising a frequency multiplier coupled and/or connected to an oscillator output for generating an output signal of the frequency generator arrangement having a multiplier frequency corresponding to a multiple of the oscillator frequency, wherein the frequency multiplier comprises a frequency multiplier core directly causative of the frequency multiplication, the frequency multiplier core having a power supply, and the frequency generator arrangement having a control input for controlling the power supply to the frequency multiplier core, whereby
(Continued)

an output power of the output signal is adjustable by controlling the power supply to the frequency multiplier core.

18 Claims, 3 Drawing Sheets

(51) Int. Cl.
    *H03B 1/02*     (2006.01)
    *H03C 1/36*     (2006.01)
    *H03K 7/08*     (2006.01)

(52) U.S. Cl.
    CPC ......... *H03K 7/08* (2013.01); *H03B 2201/038* (2013.01)

(58) Field of Classification Search
    USPC ............ 455/296, 76; 327/115, 117; 342/128, 342/132, 122; 331/74
    See application file for complete search history.

(56) References Cited

U.S. PATENT DOCUMENTS

| | | |
|---|---|---|
| 2017/0285136 A1 | 1/2017 | Hesse |
| 2019/0162841 A1 | 5/2019 | Peckham |
| 2020/0186175 A1* | 6/2020 | Ben-Yishay ........... H03B 19/14 |

OTHER PUBLICATIONS

Ergintav Arzu et al. "An Integrated 122GHz Differential Frequency Doubler with 37GHz Bandwidth in 130 nm SiGe BiCMOS Technology" 2017 IEEE MTT-S International Conference on Microwaves for Intelligent Mobility (ICMIM), doi: 10.1109/ICMIM.2017.7918854; Mar. 19, 2017.

Murasov, K.V. et al. "The Frequency Doubler 0.4-10 Ghz with Differential Output Based on Gilbert Cell in Si—Ge 130 Nm Technology" 2018 Wave Electronics and its Application in Information and Telecommunication Systems (WECONF), doi: 10.1109/WECONF.2018.8604347; Nov. 26, 2018.

Sun, Yaoming et al. "An Integrated Harmonic Transmitter Front-End for 122 GHz FMCW/CW Radar Sensor" 2011 6th European Microwave Integrated Circuit Conference; Oct. 10, 2011.

Zhang, Shibin et al. "Design of a 0.01GHz-70 GHz High Output Power Signal Source Module" 2017 Progress in Electromagnetics Research Symposium—Fall (PIERS—FALL), doi: 10.1109/PIERS-FALL.2017.8293512; Nov. 19, 2017.

International Search Report for International Application No. PCT/EP2021/052639, dated Jun. 16, 2021.

Written Opinion for International Application No. PCT/EP2021/052639, dated Jun. 16, 2021.

International Preliminary Report on Patentability for International Application No. PCT/EP2021/052639, dated Aug. 18, 2022.

* cited by examiner

FREQUENCY GENERATOR ARRANGEMENT

CROSS-REFERENCE TO RELATED APPLICATIONS

This application is a national stage application under 35 U.S.C. 371 of PCT Application No. PCT/EP2021/052639 having an international filing date of 4 Feb. 2021 which designated the United States, which PCT application claimed the benefit of European Application No. 20156186.7 filed 7 Feb. 2020 and European Application No. 20183279.7 filed 30 Jun. 2020, each of which are incorporated herein by reference in their entirety.

The present invention relates to a frequency generator arrangement including an oscillator.

A frequency generator arrangement is an arrangement for generating a preferably at least substantially mono-frequency output signal.

An oscillator in the sense of the present invention is an electronic circuit which in operation generates a periodic, in particular substantially sinusoidal, output signal, hereinafter referred to as an oscillator signal. The oscillator signal is preferably at least substantially mono-frequency, i.e. contains substantially one frequency or one frequency dominates the output signal, which is in particular the case if this frequency comprises the greatest power spectral density, hereinafter referred to as oscillator frequency. If the oscillator generates an oscillator signal that contains multiple frequency components, the oscillator frequency is the frequency used in the following or by the components coupled and/or connected to the oscillator.

The frequency generator arrangement in the sense of the present invention is preferably adapted to generate an output signal from which the output power or amplitude can be controlled by the frequency generator arrangement.

In this context, DE 10 2014 112 806 A1 discloses a radar sensor in which an on/off switch is provided in the transmitting section, which is arranged between an oscillator and a transmitting antenna and attenuates or interrupts the connection to the transmitting antenna, while the oscillator oscillates continuously and accordingly provides its output signal continuously, which can continue to feed a mixer to process a received signal even when attenuated or interrupted by the on/off switch.

It has been shown that on/off switches, as known from the prior art, do not produce a sufficient isolation effect, especially at high frequencies, i.e. a signal still reaches the transmitting antenna due to crosstalk and is thus emitted, even if this is not intended. Alternatively, deactivating the oscillator is associated with disadvantages because, on the one hand, other components that may be fed by the oscillator no longer receive a signal and because there are considerable delays when the oscillator is reactivated due to the associated transient effects.

Therefore, it is an object of the present invention to provide a frequency generator arrangement and a radar transmitter, receiver, or use by which control of an output power up to and including deactivation can be achieved with improved isolation efficiency and low-delay controllability.

This task is solved by a frequency generator arrangement according to claim 1, by a radar transmitter according to claim 11, by a radar receiver according to claim 12 or a use according to claim 15. Advantageous further embodiments are the subject of the subclaims.

A frequency generator arrangement as proposed comprises an oscillator for generating an oscillator signal having an oscillator frequency and an oscillator output for outputting the oscillator signal. Further, the frequency generator arrangement comprises a frequency multiplier coupled and/or connected to the oscillator output for generating an output signal of the frequency generator arrangement having a multiplier frequency corresponding to a multiple of the oscillator frequency.

A frequency multiplier in the sense of the present invention is preferably an electronic circuit which, starting from an input signal, generates an output signal having a multiple of the frequency of the frequency of the input signal.

The oscillator is coupled and/or connected, preferably directly, to the frequency multiplier so that the oscillator signal, which may in particular be at least substantially sinusoidal and/or differential, is applied to the input of the frequency multiplier, whereby the frequency multiplier generates the output signal which is a multiple of the oscillator frequency.

In principle, the output signal can also have spectral components at different frequencies. In this context, the frequency of the output signal is defined as the frequency which characterizes the output signal, which comprises the highest spectral power density and/or which is used or not suppressed in the following.

The frequency multiplier comprises a frequency multiplier core, which is directly causal for the frequency multiplication.

The frequency multiplier core is preferably an electronic circuit which is directly responsible for the frequency multiplication function within the frequency multiplier.

The frequency multiplier core in turn comprises a power supply. The power supply is preferably a component, a part, a component or a circuit for presetting or controlling a current consumption of the frequency multiplier core.

As proposed, the frequency generator arrangement comprises a control input for controlling the power supply of the frequency multiplier core, whereby an output power of the output signal is adjustable or set by controlling the power supply of the frequency multiplier core.

In particular, it is possible or intended to use the control input to control or change the power supply to the frequency multiplier core while the oscillator outputs the oscillator signal at the oscillator frequency at the oscillator output, thereby controlling or changing an output power of the output signal while the oscillator outputs the oscillator signal at the oscillator frequency at the oscillator output.

Accordingly, the output power of the output signal is preferably adjustable/is adjusted or is changeable/is changed by controlling the power supply of the frequency multiplier core while the oscillator outputs the oscillator signal at the oscillator frequency at the oscillator output.

It is preferably provided that the frequency multiplier core is adjustably formed or adjusted by reducing or deactivating its power supply by means of the power supply to vary an output power or output amplitude of the output signal, hereinafter referred to as multiplier output power.

In particular, the multiplier output power is changed, especially reduced and/or controlled, during the generation of the output signal, or the multiplier output power can be changed, especially reduced and/or controlled, during the generation of the output signal. For this purpose, the frequency generator arrangement can have a power control or a power control can be assigned to it.

With the power control, the multiplier output power can be changed, in particular reduced and/or regulated, during (in the course of time) the generation of the output signal, or the frequency generator arrangement or power control can be designed for this purpose.

Preferably, the power control may change the power supply to the frequency multiplier core while the oscillator is outputting the oscillator signal at the oscillator frequency at the oscillator output to which the frequency multiplier is coupled and/or connected. For this purpose, the power controller can generate a corresponding control signal at the control input.

Surprisingly, it has been found that using the frequency multiplier to generate an attenuation, in particular to turn off the output signal, provides particularly effective control and a high isolation effect. Thus, by controlling the power supply to the frequency multiplier core, it can be achieved that the output signal is not generated at the multiple of the oscillator frequency. Any crosstalk of the oscillator signal is regularly strongly attenuated by the circuit arrangement that implements the frequency multiplier, at least if the frequency multiplier is not supplied with power or is supplied with power only to a limited extent, which is possible by controlling the power supply.

In addition, components such as loads of the frequency multiplier and/or any antenna are preferably designed for the multiplier frequency so that these components provide further suppression of the oscillator signal. Therefore, it has been shown that the use of a frequency multiplier with control of its power supply can be used very effectively to control the power of the output signal, including disabling the output signal.

The frequency multiplier may have a high-pass filter or the high-pass filter may be associated with the frequency multiplier. The high pass filter may be configured to attenuate the oscillator signal or frequencies producible by the oscillator, while the multiplier frequency is at least substantially unattenuated or less attenuated than the oscillator signal or frequencies producible by the oscillator. The high-pass filter may have a 3 dB corner frequency, which is preferably between a frequency of the oscillator signal or frequencies producible by the oscillator and the multiplier frequency.

Particularly preferably, the high-pass filter is formed by a waveguide or a waveguide function element. Waveguides have the property of attenuating frequencies below the cut-off frequency. The cut-off frequency of a waveguide that forms or can form the high-pass filter is therefore preferably between a frequency of the oscillator signal or the frequencies that can be generated by the oscillator and the multiplier frequency.

The frequency multiplier core may be formed by an electrical circuit which, when an input to this circuit is driven by the oscillator signal at the oscillator frequency, produces the output signal at a multiple of the oscillator frequency. In particular, it is a frequency doubler or frequency quadrupler.

Particularly preferably, the frequency generator arrangement comprises a single-stage frequency multiplier, in particular a frequency doubler, i.e. a frequency multiplier with exactly one frequency multiplier core. In this case, the oscillator output is directly coupled and/or connected to the multiplier input of the frequency multiplier and the frequency multiplier directly forms the output signal. Several partial multipliers may here be divided among several, in particular cascaded, partial frequency multiplier cores, whereby it may be sufficient that one of the partial frequency multiplier cores is controllable or controlled as described below.

Alternatively, the frequency multiplier can also be multi-stage, i.e. have several frequency multiplier cores, in particular a cascade of frequency multiplier cores connected in series. In this case, it is sufficient if the properties described below on the basis of a frequency multiplier core are realized by at least one controllable of the multiple frequency multiplier cores.

A controllable frequency multiplier core in the sense of the present invention is preferably a frequency multiplier core having a power supply via which an (multiplier) output power of the output signal formed by it is controllable or controlled.

The controllable one of the frequency multiplier cores is then coupled and/or connected directly or indirectly, in particular via one or more further frequency multiplier cores, to the oscillator output. If the controllable one of the frequency multiplier cores is indirectly coupled and/or connected to the oscillator output and/or driven by an oscillator signal of an already (pre-)multiplied oscillator frequency, an oscillator signal pre-processed by the preceding frequency multiplier core(s) is present at an input of the controllable one of the frequency multiplier cores, which signal may have an already pre-multiplied oscillator frequency. The oscillator signal is thus indirectly pre-processed, in particular with a pre-multiplied oscillator frequency. From this already pre-multiplied oscillator frequency, the controllable one of the frequency multiplier cores then generates the output signal with a correspondingly multiplied oscillator frequency by frequency multiplication.

In a frequency multiplier with multiple frequency multiplier cores, the controllable frequency multiplier core explained in more detail below is preferably the one that forms the output signal directly, i.e., preferably the last link in a cascade of frequency multiplier cores. Alternatively or additionally, the controllable frequency multiplier core may form the output signal indirectly after further processing by one or more subsequent frequency multiplier cores.

The frequency generator arrangement preferably comprises a power control adapted to reduce the output power of the frequency generator arrangement by controlling the power supply of the frequency multiplier core within the output signal in at least one (time) interval.

In other words, the frequency generator arrangement is designed or controlled to temporarily attenuate or deactivate the output signal. In this way, for example, the radiation of signals via an antenna that can be connected to the frequency generator arrangement can be controlled, in particular to avoid interference.

The oscillator, which is connected (directly or indirectly) to the frequency multiplier, is preferably independent of this or continues to generate the oscillator signal at the oscillator frequency.

The power control is preferably designed or operated to reduce the output power of the frequency generator arrangement at least in a time interval and/or in at least one frequency range in order to avoid a collision or interference with an external signal.

In this context, the frequency generator arrangement can have a collision detection device for detecting collision or interference, or such a device can be assigned to it, whereby this automatically adjusts the output power of the output signal, in particular automatically deactivates the output signal, preferably via the control input by means of the control of the power supply, if a (potential) collision or interference is detected.

The frequency generator arrangement preferably comprises an oscillator controller that is designed or operated to generate radar signals, in particular FMCW signals, by controlling the oscillator.

The oscillator is preferably a tunable oscillator in which the oscillator frequency is variable, in particular adjustable. Very preferably, the oscillator is a voltage-controlled oscillator, also called a VCO. Alternatively, however, it can also be a current-controlled oscillator, also called CCO, or an oscillator that can be controlled in other ways with regard to the oscillator frequency.

For the generation of radar signals, especially FMCW signals, the oscillator can be controlled to generate a so-called frequency ramp. Here, the oscillator frequency is changed with a preferably at least substantially constant frequency gradient, so that a preferably at least substantially linear ramp is generated in a diagram of the oscillator frequency over time. In principle, however, other types of radar signals can also be generated by the oscillator or the oscillator can be controlled for this purpose. In particular, it is thus provided that a frequency ramp is generated by the oscillator as an oscillator signal and, correspondingly, the output signal of the frequency multiplier also comprises a corresponding ramp shape at a multiplied frequency.

It is further preferred that the oscillator control or the oscillator signal generated by the oscillator in the form of a radar signal is not influenced while the output signal of the frequency generator arrangement is reduced in its output power in a (time) interval of the radar signal originating from the oscillator and multiplied in its frequency by the frequency multiplier, in particular with the output power being at least substantially completely reduced or switched off. In this way, a particularly effective interference avoidance can be realized.

It is further preferred that outside the (time) interval a waveform of the output signal corresponds to the waveform of the oscillator signal, but at a multiple of the oscillator frequency. In particular, it is preferred that outside the (time) interval a multiplier frequency of the output signal corresponds to the multiple of the oscillator frequency. Alternatively or additionally, it is preferred that outside the (time) interval a frequency gradient of the output signal corresponds to the frequency gradient of the oscillator signal. Alternatively or additionally, it is preferred that outside (time) interval a frequency gradient corresponds to the frequency gradient of the oscillator signal at a multiple frequency of the oscillator frequency. Finally, it is preferred that an oscillator output power is permanent and/or a multiplier output power is at least substantially constant outside the (time) interval.

In particular, it is thus provided that a frequency ramp is generated by the oscillator as an oscillator signal and correspondingly the output signal of the frequency multiplier also comprises a corresponding ramp shape at a multiplied frequency, apart from the (temporal) interval in which the output signal can be attenuated or deactivated and here does not necessarily have a frequency. The time dependence of the frequency thus preferably remains constant over the entire ramp, while the amplitude or output power of the output signal is attenuated or at least substantially deactivated in the (time) interval.

In other words, it is preferred that the output signal of the frequency generator arrangement comprises—preferably on both sides—adjacent to the interval an at least substantially constant frequency rate of change or an at least substantially constant frequency gradient and a preferably constant amplitude, so that an interpolation of a frequency characteristic of the output signal over the interval leads to a (complete) ramp shape with a continuous, in particular linear, characteristic with an at least substantially constant frequency rate of change or an at least substantially constant frequency gradient of the output signal, in particular an FMCW radar ramp.

It has been shown in a surprising manner that a radar system having a function in which a portion of the ramp, a frequency portion, or a temporal portion, respectively, can be suppressed in the manner mentioned is particularly well suited for interference avoidance, while the remaining ramp portions can be sufficient for good performance of the radar system operated therewith.

The power supply device preferably comprises or is formed by a controllable current source. The controllable current source is preferably controllable via the control input. Particularly preferably, the controllable current source is implemented by a current mirror circuit that is coupled and/or connected to the control input.

The frequency multiplier preferably comprises an electronic filter. An electronic filter in the sense of the present invention is preferably a device, in particular formed by one or more electronic components, which is designed for frequency-selective transmission and/or attenuation. In particular, this may be one or more oscillating circuits and/or waveguides, in particular microstrip lines.

Thus, in the result, it is preferred that the frequency multiplier comprises one or more oscillating circuits and/or waveguides as a load of the frequency multiplier core, so that the oscillator frequency in the output signal is suppressed, but preferably not the oscillator frequency multiplied by the frequency multiplier, which may be amplified with respect to the oscillator frequency. In this way, a filter effect can be created which improves the isolation effect by the frequency multiplier core having the power supply.

In a preferred embodiment, the frequency multiplier, in particular the frequency multiplier core, comprises a Gilbert cell or is based on a structure similar to a Gilbert cell. This is preferably coupled and/or connected to the oscillator output in such a way that the oscillator signal drives the frequency multiplier on the input side, preferably differentially. Alternatively or additionally, the frequency multiplier core with the Gilbert cell provides an output signal on the output side, preferably differential, of twice or more the oscillator frequency.

Another aspect of the present invention, which may also be implemented independently, relates to a radar transmitter, wherein the radar transmitter comprises a frequency generator arrangement according to any of the preceding aspects and is couplable/connectable or coupled and/or connected to a radar antenna such that the output signal of the frequency generator arrangement is transmittable or radiatable via the radar antenna.

Another aspect of the present invention, which may also be implemented independently, relates to a radar receiver, the radar receiver comprising a frequency generator arrangement of the previous aspects and at least one mixer.

The mixer is configured to convert a frequency of a received signal that is receivable by means of a radar antenna that is couplable or coupled and/or connected to the mixer.

The mixer is coupled and/or connected to the output of the frequency generator arrangement such that the mixer is arranged to have the received signal frequency-convertible by the mixer using the output signal of the frequency generator arrangement as a local oscillator signal. Thus, as a result, the mixer is arranged to mix the received signal with the output signal of the frequency generator arrangement using the output signal of the frequency generator arrangement as a local oscillator signal of the mixer so that the received signal is shifted by the frequency of the output signal.

Here, the mixer is preferably designed to shift the frequency towards lower frequencies. If the mixer simultaneously effects a frequency shift to lower and higher frequencies, the component at the higher frequencies can be suppressed or attenuated. However, other solutions are possible as well, especially if the mixer does not form part of a radar receiver, as it is preferred here.

Preferably, the radar receiver is adapted to supply the mixer with a local oscillator signal in the form of the oscillator signal, while the output signal of the frequency multiplier or of (another) frequency multiplier coupled and/or connected to the same oscillator is reduced in power in particular is or is substantially switched off, by means of the power supply of the frequency multiplier.

Thus, it is principally possible, and in particular also provided in the radar receiver as proposed, that the oscillator is independent of the power supply of the frequency multiplier, i.e. when the output signal of the frequency multiplier is reduced or deactivated, the function of the oscillator for forming the oscillator signal is unchanged.

Another aspect of the present invention relates to a radar system comprising a radar transceiver comprising a radar transmitter and a radar receiver according to the preceding aspects, wherein the radar transmitter and the radar receiver preferably share a common frequency generator arrangement, or at least the oscillator according to any of the preceding aspects.

The multiplier output is thus coupled or couplable and/or connected to an antenna, in particular for transmission, and at the same time a multiplier output is coupled and/or connected as a local oscillator signal to the mixer of the radar receiver. The same output signal can be used for this purpose.

Alternatively or additionally, several frequency multipliers or, in any case, frequency multiplier cores are provided, each of which is/are controlled by the same oscillator signal or the same pre-multiplied oscillator signal or is/are coupled and/or connected to the same oscillator output or the same upstream frequency multiplier core. Accordingly, several identical or mutually corresponding output signals can be generated, which can be separately controllable via the power supply of the (respective) frequency multiplier core.

Accordingly, the output signal can be transmitted/radiated by means of the antenna, and/or a received signal can be received—preferably simultaneously—by means of the same or another antenna, the radar receiver being coupled or couplable and/or connected to the radar antenna in such a way that the received signal can be converted (in its frequency) by the mixer of the radar receiver, particularly preferably by the frequency of the output signal of the frequency generator arrangement.

The power control is designed to reduce the output power of the frequency generator arrangement in a start-up phase and/or in a shut-down phase of the frequency generator arrangement, the oscillator and/or a control associated with the oscillator by controlling the power supply of the frequency multiplier core.

In the start-up phase and/or in a switch-off phase, interference signals such as signal components in impermissible frequency ranges can arise. Advantageously, the proposed frequency generator arrangement makes it possible to suppress such interference signals or undesired signal components by generating them from the oscillator but reducing or suppressing their power by means of the frequency multiplier.

The frequency generator arrangement may include a control loop to control the output power of the output signal to a reference variable by controlling the power supply to the frequency multiplier core.

Advantageously, the output power of the output signal can be regulated by controlling the power supply of the frequency multiplier core to a fixed value or predetermined variation over the multiplier frequency, oscillator frequency, and/or time.

The control of the output power preferably makes it possible to control the output power over different multiplier frequencies or oscillator frequencies, in particular to keep it constant.

Thus, it is possible to specify a radar signal, preferably an FMCW signal, in particular a frequency ramp 23 with the oscillator, while the output power of the output signal can be or is regulated by controlling the power supply of the frequency multiplier core, in particular to a constant value. This can provide a linearization which is advantageous, particularly in radar systems, since such linearization can improve precision and reliability in this context.

In another aspect, which may also be implemented independently, the present invention relates to the use of a frequency multiplier of a frequency generator arrangement comprising an oscillator, which is coupled and/or connected on the output side to an input of the frequency multiplier, for controlling an output power of an output signal of the frequency generator arrangement.

Controlling the output power by varying the operating point of the frequency multiplier, especially instead of disabling the oscillator or using other (adjustable) attenuators, switches or the like, has been shown to be particularly effective in achieving good isolation values.

Further aspects, advantages and features of the present invention will be apparent from the claims and from the following description of preferred embodiments with reference to the drawing.

It shows.

In the figures, the same reference signs are used for the same or similar components, and accordingly the same or similar properties and advantages can be achieved, even if a repeated description is omitted.

Figure 1:
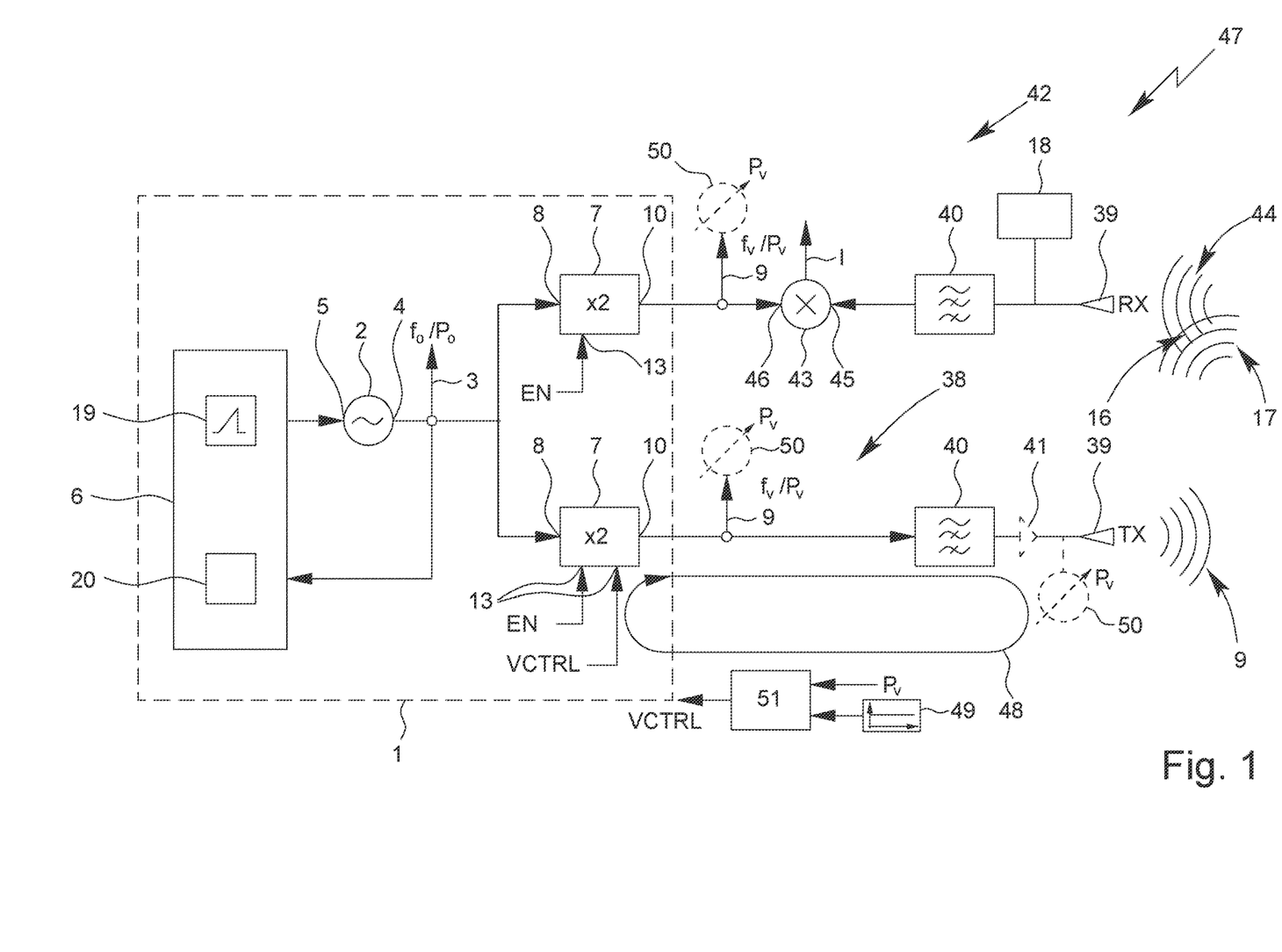
FIG. 1 schematic view of a radar transceiver.

FIG. 1 shows a schematic view of a radar transceiver with a frequency generator arrangement 1 as proposed with an oscillator 2 for generating an oscillator signal 3. The oscillator signal 3 is output at an oscillator output 4.

The oscillator 2 can be adjustable via an oscillator control input 5, preferably with respect to its oscillator frequency fo. In the illustration example, this is achieved by feedback or control by means of a phase-locked loop (PLL) 6, which controls the oscillator 2 via the oscillator control input 5 to a specific oscillator frequency fo or a specific frequency characteristic of the oscillator frequency fo.

The frequency generator arrangement 1 as proposed further comprises at least one frequency multiplier 7 coupled and/or connected to the oscillator output 4. The frequency multiplier 7 is designed to generate an output signal 9 of the frequency generator arrangement 1. The output signal 9 preferably comprises a multiplier frequency fv corresponding to a multiple of the oscillator frequency fo.

The frequency multiplier 7 comprises a multiplier input 8 preferably coupled and/or connected to the oscillator output 4, so that the oscillator signal 3 forms an input signal of the frequency multiplier 7. Further, the frequency multiplier 7 preferably comprises a multiplier output 10 via which the output signal 9 can be delivered.

The frequency multiplier 7 can be of single- or multi-stage design. In the example shown, it is preferably a single-stage frequency multiplier 7 with the property that a (oscillator) signal 3 applied to the multiplier input 8 is processed by the frequency multiplier 7 in such a way that the output signal 9 comprises twice the frequency as the multiplier frequency fv in comparison. This is therefore in particular a frequency doubler. In principle, however, frequency quadrupliers or other frequency multipliers 7 can also be used.

Figure 2:
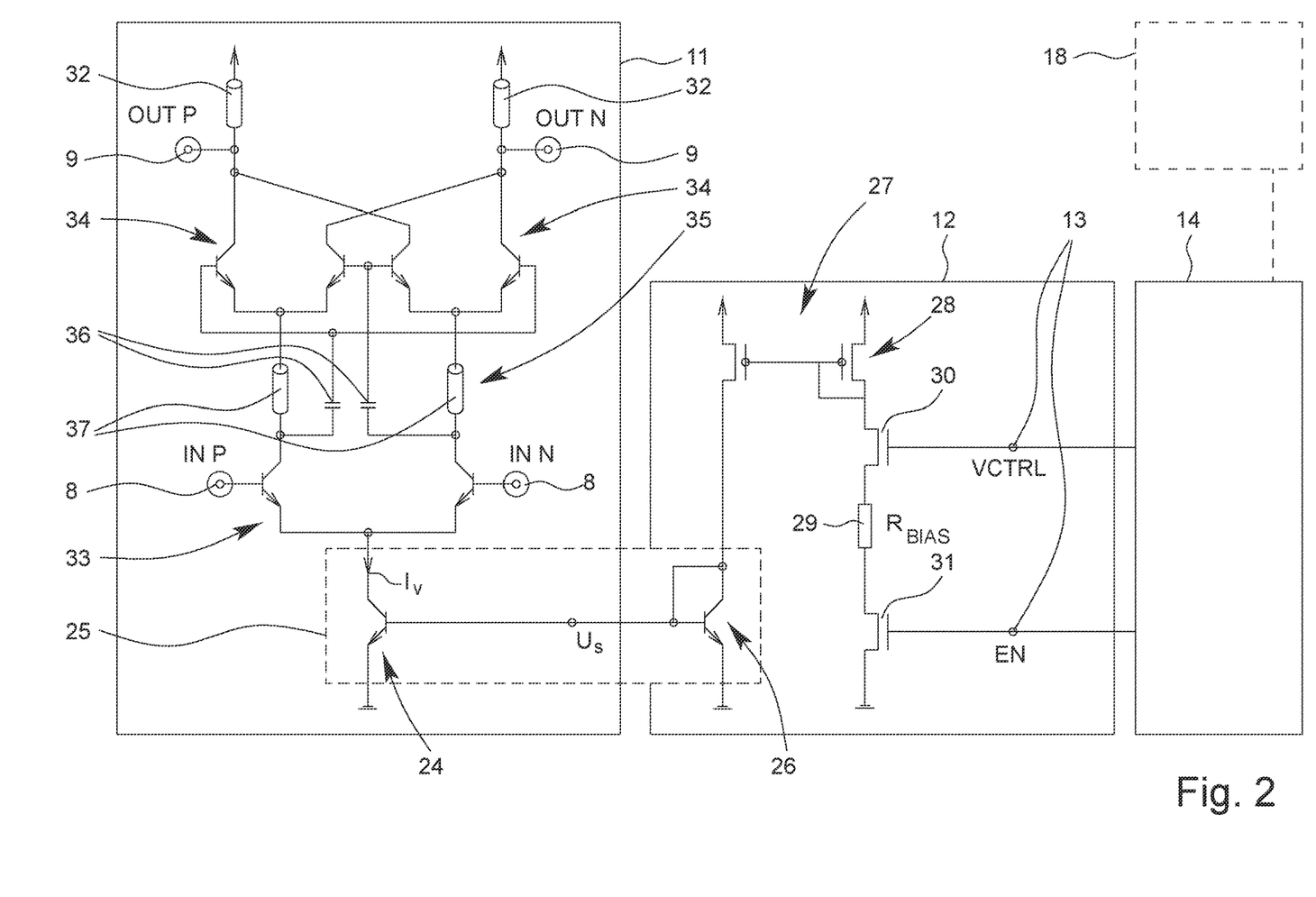
FIG. 2 simplified circuit diagram of a proposed frequency multiplier.

FIG. 2 shows a simplified circuit diagram of the frequency multiplier 7 as proposed.

The frequency multiplier 7 preferably comprises a frequency multiplier core 11. This is directly responsible for the frequency multiplication. The frequency multiplier core 11 thus converts a signal applied to the multiplier input 8 into the output signal 9, the output signal 9 having a multiplier frequency fv which corresponds to a multiple of the frequency of a signal applied to the multiplier input 8, i.e. in particular to a multiple of the oscillator frequency fo.

The frequency multiplier core 11 comprises a power supply 12. The power supply 12 is responsible for supplying electrical power to the frequency multiplier core 11. In other words, the energy supply 12 determines or influences the operating point of the frequency multiplier core 11. In particular, the energy supply 12 is a current source. Alternatively or additionally, however, it may also be a voltage source or other device for controlling the power consumption of the frequency multiplier core 11.

The power supply 12 is preferably controllable. For this purpose, the frequency generator arrangement 1 may have a control input 13 for controlling the power supply 12 of the frequency multiplier core 11. Accordingly, by controlling the power supply 12 by means of the control input 13, a multiplier output power Pv of the output signal 9 can be adjusted.

This allows, especially at frequencies in the millimeter wave range, or between 30 GHz and 300 GHz, a particularly effective way of generating the output signal 9 with a correspondingly high multiplier frequency fv and at the same time a controllable multiplier output power Pv of the output signal 9.

Indeed, it has been shown that the use of switches or (variable) attenuators to vary the output power of prior art frequency generators regularly leads to undesirable effects such as attenuations due to the fundamental use of corresponding assemblies due to parasitic effects, so that the use of the frequency multiplier 7 proposed herein to control the output power of the output signal 9 does not require any additional components or assemblies and at the same time helps to avoid the parasitic losses associated with the use of corresponding assemblies.

The frequency generator arrangement 1 may have a power control 14 coupled and/or connected to the control input 13, as schematically indicated in FIG. 2. The power control 14 is adapted to control the multiplier output power Pv of the output signal 9 by controlling the power supply 12 of the frequency multiplier core 11.

Figure 3:
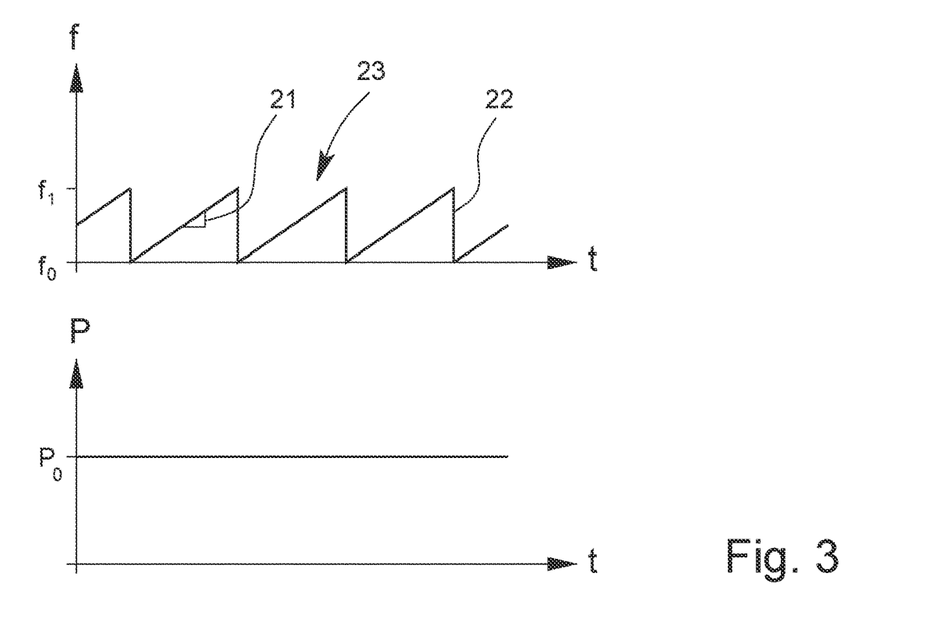
FIG. 3 Diagrams of the oscillator signal.
Figure 4:
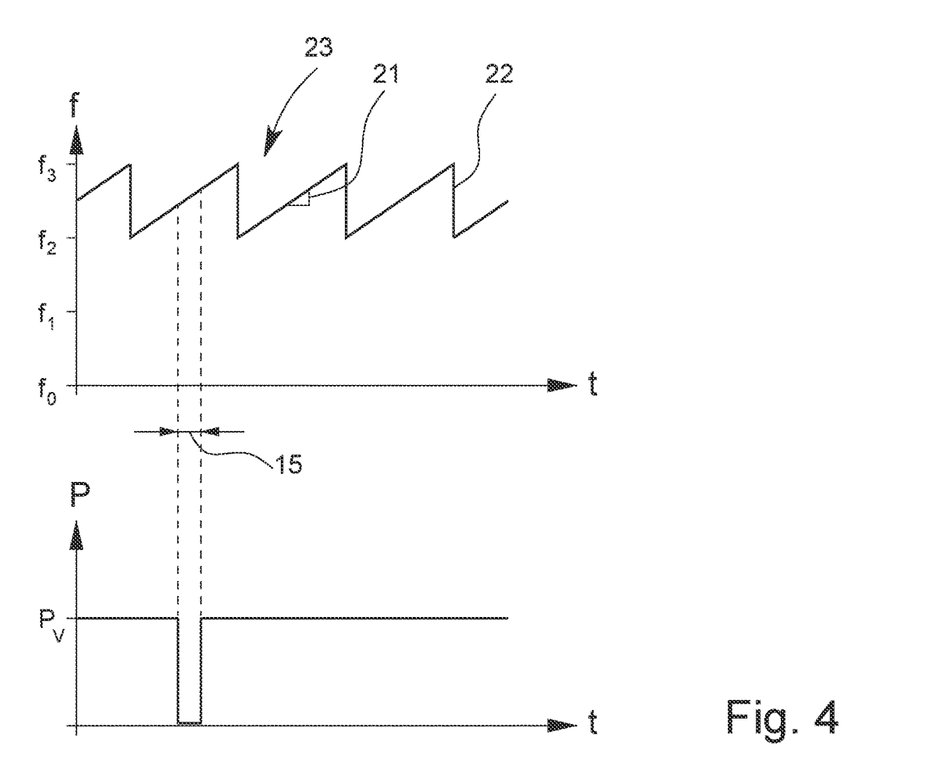
FIG. 4 Diagrams of the output signal.

FIGS. 3 and 4 show schematic diagrams of the oscillator frequency fo and the oscillator output power Po of the oscillator signal 3 and of the multiplier frequency fv and the multiplier output power Pv of the output signal 9. The specific curves will be discussed in more detail later.

As exemplarily identified in FIG. 4, an interval 15 may be provided in which the multiplier output power Pv is reduced or at least substantially switched off.

In the illustration example, this is a temporal interval, i.e. a temporal (partial) section of the output signal 9. Alternatively or additionally, however, it is still possible that the multiplier output power Pv in the output signal 9 is or will be reduced in a certain frequency range, in particular switched off.

In the illustration example, the temporal interval 15 comprises a course with variable multiplier frequency fv, during which the multiplier output power Pv is reduced or switched off, so that in the present embodiment example the multiplier output power Pv is or is reduced, in particular switched off, both in a temporal interval and correspondingly also in a specific frequency range. However, other variants are also possible here.

In particular, the reduction can be controlled as a function of frequency, i.e. the reduction can take place at predetermined frequencies or in predetermined frequency spectra. Alternatively or additionally, it is not mandatory that the reduction takes place during a course with variable multiplier frequency fv. The multiplier output power Pv of a signal that is at least essentially mono-frequency at the time of reduction can also be reduced.

The reduction of the multiplier output power Pv or the switching off of this is achieved particularly preferably by controlling the power supply 12. For this purpose, the power control 14 can influence the power supply 12 via the control input 13 in such a way that the multiplier output power Pv is or being reduced or activated.

As indicated in FIG. 1, it is possible in practice that interference 16 with an external signal 17 is to be avoided. For this purpose, an interference detector 18 can be provided which can detect a corresponding external signal 17 or interference 16.

The power control 14 may be coupled and/or connected to or include the interference detector 18 so that when interference 16 is detected, the multiplier output power Pv, particularly in the interval 15 or corresponding frequency range, is reduced or turned off so that interference 16 or interference 16 with the external signal 17 possible due to collision is avoided.

The avoidance of interference 16 by means of the frequency generator arrangement 1 as proposed has proved to be particularly effective. This is because, due to the use of the frequency multiplier 7 for controlling the multiplier output power Pv of the output signal 9 of the frequency generator arrangement 1, it is possible and preferred that the oscillator 2 is operated unchanged or uninterrupted or that its oscillator signal 3 is generated permanently, at least substantially independently of whether the multiplier output power Pv corresponds to its maximum or nominal value or is reduced or deactivated in the manner described.

In principle, the frequency generator arrangement 1 as proposed can be used in various fields of technology, in particular radio technology. This includes communication systems in which the output signal 9 can be used as a reference or carrier signal for modulating information for the purpose of radio data transmission or the like. On the other hand, particularly preferred and explained here in more detail with the present embodiment example in the following is the use in connection with radar systems. Very particularly preferred is the use of the frequency generator arrangement 1 as proposed in a so-called FMCW radar system.

With reference to FIG. 1, the frequency generator arrangement 1 as proposed may have an oscillator control 19. Optionally, a reference 20 such as a crystal is associated with this to enable stabilization. In the illustrative example, the oscillator control 19 forms part of the phase-locked loop/PLL 6. However, the oscillator control 19 may also be implemented separately therefrom. The oscillator control 19 is preferably designed to control the oscillator 2 in such a way that it generates a radar signal.

As shown in FIG. 3 in the course of the oscillator frequency fo of the oscillator signal 3, the oscillator signal 3 may be frequency modulated, whereby a frequency gradient 21 may be formed in an oscillator signal 3 realized as an FMCW signal 22. As a result, one or more frequency ramps 23 may be generated thereby. A frequency ramp is an FMCW signal 22 or part thereof in which the oscillator frequency fo is changed at least substantially continuously and/or with an at least substantially constant frequency gradient 21 over time. The output signal 9 also comprises corresponding properties, with the difference that here the same applies to the multiplier frequency fv as a multiple of the oscillator frequency fo. Assuming that the oscillator signal 3 is multiplied in its oscillator frequency fo by means of the frequency multiplier 7, the characteristic of the oscillator frequency fo essentially corresponds to the characteristic of the multiplier frequency fv apart from the frequency multiplication.

The multiplier output power Pv of the output signal 9 can be controlled accordingly in the FMCW signal 22 by controlling the power supply 12 of the frequency multiplier 7.

Especially, the frequency generator arrangement 1 is accordingly designed to reduce, preferably at least substantially switch off, the multiplier output power Pv in the time interval 15 in the FMCW signal 10 or other radar signal as output signal 9. This does not require deactivation of the oscillator 2. In contrast, the oscillator control 19 or the FMCW signal 22 or other radar signal generated by the oscillator 2 can be independent of the control of the multiplier output power pc. In the illustration example, this can be seen from the fact that in FIG. 3 the FMCW signal 22 as oscillator signal 3 comprises a preferably at least substantially invariable or constant oscillator output power Po, while the multiplier output power Pv is reduced and in particular deactivated in the interval 15.

It is preferred that the interval 15 extends only over a part of a radar signal, in particular FMCW signal 22, and very preferably only over a part or fraction of a frequency ramp 23 of FMCW signal 22 as output signal 9. It is thus intended that the multiplier output power Pv of the output signal 9 is or will be reduced or switched off in its multiplier output power Pv only in a part of the course of a frequency ramp 23.

For example, it may be provided that the (temporal) interval 15 extends over less than 50% preferably less than 40% and in particular less than 30% of a frequency ramp 23. In this way, a function of an associated radar system is maintained, while interference 16 with the external signal 17, for example, can be avoided by the measures described. Alternatively or additionally, the transmission of the radar signal, in particular FMCW signal 22, can take place in a (regulatory) protected frequency range, in particular with a requirement for a significantly reduced transmission power. It is thus possible, with an uninterrupted frequency ramp 23, to nevertheless maintain varying boundary conditions over the frequency. This can improve the performance of the radar system.

Outside the interval 15, on the other hand, the output signal 9 preferably exhibits an at least substantially steady frequency response or constant frequency gradient 21. Alternatively or additionally, the output signal 9 preferably comprises a multiplier output power Pv, which may be at least substantially constant outside the interval 15, while it is preferably reduced or deactivated in the interval 15. Accordingly, the output signal 9 may form an FMCW signal 22 outside the interval, in particular one or more frequency ramps 23.

With reference to FIG. 2, a possible design of the frequency multiplier(s) and its power supply 12 is explained in more detail below. It is understood that in principle also other frequency multiplier concepts can be used, in which a multiplier output power Pv can be influenced by the power supply 12.

In the illustrative example according to FIG. 2, the power supply 12 comprises a current source 24, which in the illustrative example is implemented by a suitably regulated transistor, in particular a bipolar transistor and, in the specific embodiment example, an npn silicon bipolar transistor.

The current source 24 is preferably controlled in such a way that it impresses at least substantially constant core current Iv on the multiplier core 11 in all other respects. The power supply 12 or current source 24 is preferably arranged to control this core current Iv, in particular to reduce it from a nominal value, in order to control or reduce the multiplier output power Pv.

In the illustration example, the current source 24 is preferably implemented by a so-called current mirror circuit 25. In a current mirror or current mirror circuit 25, a control input of the current source 24, in particular of the transistor forming it, in particular a base of the transistor, is coupled and/or connected to the control input of a reference transistor 26, in this case also preferably the base thereof. In this case, the reference transistor 26 is preferably a transistor which is connected in such a way that a control voltage Us is generated at the control input of the transistor forming the current source 24, via which control voltage the core current Iv is determined to be at least substantially equal to, multiple or corresponding to a current flowing through the reference transistor 26.

As shown in the illustrative example according to FIG. 1, a frequency multiplier 7 may also have multiple control inputs 13. A control input 13 may be provided or configured for at least substantially completely turning off the output power Pv, coupled and/or connected in FIG. 1 to an "enable" signal EN. Alternatively or additionally, a control input 13 may be coupled and/or connected to a "control" signal VCTRL, preferably for reducing or controlling the output power Pv without turning it off. One of or both signals may influence, control or vary the control voltage Us. The control voltage Us may correspond to one or both of the signals, or may form or represent one or both of the signals.

In a current mirror circuit 25, the control input 13—the base in the present embodiment example—is usually coupled and/or connected to a further terminal of the reference transistor 26 for this purpose, preferably to the collector terminal or drain terminal in the case of MOSFET transistors used, so that the same current flowing through the reference transistor 26 and the current source 24 results. By dimensioning the reference transistor 26 and the transistor forming the current source 24 differently, it is possible that a ratio between the core current Iv and the current flowing through the reference transistor 28 is set. For more details on the design, reference is made to the usual technical literature in this respect.

In the illustration example, the core current Iv is preferably controllable via the control input 13.

First of all, in principle, a resistor 29 can be provided which, on the basis of the voltage dropping across it, predetermines a current which, via the reference transistor 26, can predetermine the control voltage Us and, as a result, the core current Iv. In this respect, however, there are also other possibilities of realization.

In the embodiment example, it is further provided that at least one control input 13 is provided which is coupled and/or connected to a transistor 30, 31 so that a control variable, in particular control voltage, applied to the control input 13 determines or varies the core current Iv. In the example shown, the current flowing through the resistor 29 is influenced and thereby directly or indirectly causes the core current Iv to change.

A control transistor 30, 31 is preferably a transistor connected to control the current flowing through resistor 29 or through reference transistor 26, respectively, and in this or other ways in result directly or indirectly controlling core current Iv.

In principle, several control inputs 13 can also be provided. In the embodiment example according to FIG. 2, there are two control inputs 13, each of which is coupled and/or connected to the control input (base/gate) of a control transistor 30, 31. Of these control inputs 13, one control input 13 can be designed or used for reducing the multiplier output power Pv, while the other control input 13 is designed or used for switching the frequency multiplier 7 or its multiplier output power Pv on or off. In principle, however, both functions can also be realized with only one control input 13 or control transistor 30, 31.

In the illustration example, a path via the control transistor 30, 31 and the resistor 29 results in a current which is mirrored with a further current mirror 27 to the current mirror circuit 25, via which in turn the core current Iv is impressed. This design with two current mirrors 25, 27 has proven to be well suited to provide sufficient adjustability of the core current Iv even with limited supply voltages.

In the illustration example, the further current mirror 27 is implemented by means of (P-channel) MOSFET transistors. The further current mirror 27 preferably comprises a reference transistor 28 for generating a reference voltage which is coupled and/or connected to a transistor of the further current mirror 27 used as a current source for controlling the latter. In the embodiment example, the current to be mirrored through the reference transistor 28 generating the reference voltage is predetermined by the resistor 29 and/or the control transistors 30, 31.

In principle, however, alternative current mirrors 27 or other structures may be used to control the controllable current source, the transistor forming the current source 24, or the power supply 12 in general.

The frequency generator arrangement 1 preferably comprises one or more filters or filtering electronic components. In the sense of the present invention, these are preferably electronic components or structures which have an attenuation dependent on the frequency, i.e. which behave in particular with a high-pass, low-pass or band-pass.

In the example shown, the frequency multiplier core 11 comprises inductors or waveguides, in particular striplines, as loads 32, which have an impedance dependent on the frequency and correspondingly produce an amplification or attenuation dependent on the frequency, i.e. generate a filter effect. Alternatively or additionally, further filters or filtering structures can be provided.

The loads 32 or other filters or filtering structures are preferably designed to attenuate the oscillator frequency fo or to attenuate it more than the multiplier frequency fv. In this way, an improved isolation effect of the frequency multiplier 7 can be achieved. By this is meant in particular that by attenuating the oscillator frequency fo a crosstalk of the oscillator signal 3 applied to the multiplier input 8 to the multiplier output 10 is reduced by a filter effect. This can be caused by the fact that the load 32 or its impedance is lower for the oscillator frequency fo than for the multiplier frequency fv, which is why a portion of the oscillator signal 3 reaching the load(s) 32 via any parasitic effects in the frequency multiplier 7 produces only a small(er) voltage swing at the load(s) 32, whereby its portion of the output signal 9 can be reduced and preferably neglected.

The frequency generator core 11 may resemble a Gilbert cell in its basic structure, with a first differential stage 33 forming the multiplier input 8 coupled and/or connected to two further differential stages 34, in particular via a coupling network 35.

Through this coupling network 35, the control inputs of the second differential stages 34 are capacitively coupled and/or connected to outputs of the first differential stage 33 and/or inductors or waveguides 37 are preferably provided between inputs and outputs (sources, collectors and drains, emitters) of the first differential stage 33 and the second differential stages 34.

The capacitors 36 preferably couple signals between a node at which the respective inductor or waveguide 37 is connected to the respective transistor of the first differential stage 33 and the respective control input, in particular the respective base, of the transistors forming the second differential stages 34. The second differential stages 34 are preferably cross-coupled to the two loads 32.

The structure of the differential stages 33, 34 underlying the frequency multiplier 7 or frequency multiplier core 11 is also called a Gilbert cell. Accordingly, the present device is preferably a Gilbert cell-based frequency multiplier 7, in particular a frequency doubler. In particular, it is a so-called bootstrapped Gilbert frequency doubler, whose core current Iv is varied here as proposed for the purpose of controlling its multiplier output power Pv. In principle, other doubler or multiplier topologies are also suitable, in particular those which can be controlled in a corresponding manner with a controlled current source 24.

In principle, it is possible for a plurality of frequency multipliers 7 to be provided, one or more of which may be coupled and/or connected to the same oscillator 2 to produce in each case a preferably identical, similar and/or mutually corresponding output signal 9 at a multiplied oscillator frequency fo.

If, as is preferred, the multiplication factor of the respective frequency multipliers 7 is the same, they basically generate the same output signal 9. However, it is possible and preferred that corresponding different frequency multipliers 7 have separate control inputs 13 from each other so that the different frequency multipliers 7 can be controlled separately from each other, in particular their output signals 9 can be attenuated and/or deactivated differently and separately from each other.

In the example shown in FIG. 1, the oscillator 2 with its oscillator output 4 is coupled and/or connected to the multiplier inputs 8 of two or more frequency multipliers 7. The frequency multipliers 7 can be controlled separately from each other, i.e. in particular switched off, via their respective control input 13. In this way, for example, reception can be realized with one of the frequency multipliers 7, while transmission is prevented by deactivating another of the frequency multipliers 7.

In one aspect, the present invention relates to a radar transmitter 38, i.e. a transmission path of a radar system, which may comprise the frequency generator arrangement 1 as proposed. Furthermore, the radar transmitter 38 preferably comprises a radar antenna 39 via which the output signal 9 can be transmitted, preferably filtered by means of a, (in particular high pass) filter 40. Optionally, a power amplifier 41 can be provided, which routes the output signal 9 amplified to the antenna 39.

In the case of the radar transmitter 38, the multiplier output power Pv of the frequency multiplier 7 can preferably be reduced or deactivated via the control input 13 of the frequency multiplier 7, in particular as previously described, whereby the radiated power of the output signal 9 via the antenna 30 can be attenuated or deactivated. This may serve, for example, interference avoidance, as previously explained.

In another aspect, the present invention relates to a radar receiver 42, i.e. a receive path of a radar system, comprising a frequency generator arrangement 1 as proposed. Again, it is preferred that the frequency multiplier 7 is controllable via the control input 13 with respect to the multiplier output power Pv of the output signal 9, or that the multiplier output power Pv is deactivatable via the control input 13.

The radar receiver 42 preferably comprises a frequency converter, in particular mixer 43, with which a received signal 44 receivable via a or the radar antenna 39 can be converted in its frequency. A received reception signal 44 can therefore be processed by the mixer 43 in such a way that the frequency components contained in the reception signal 44 are shifted.

For this purpose, the received signal 44 can be coupled and/or connected to a signal input 45 of the mixer 43 via an optional filter 40, in particular a high-pass filter. In addition, the mixer 43 preferably comprises a control input 46 for a so-called local oscillator signal, which in the present case is preferably formed by the output signal 9. The mixer 43 preferably comprises the property of shifting the frequency of spectral components of the received signal 44 by the local oscillator frequency, in this case by the multiplier frequency fv.

The filter 40, in particular of the transmit path/radar transmitter 38 and/or the receive path/radar receiver 42, may comprise a waveguide. In particular, the filter 40 is formed by a waveguide or a waveguide functional element generated by a waveguide. The waveguide may have a high-pass characteristic due to its cut-off frequency. This allows the waveguide to perform the high-pass filter function. The waveguide can alternatively or additionally effect a coupling of the frequency generator arrangement 1 directly or indirectly with the radar antenna 39 or the transmission of the output signal 9 and/or the received signal 44. In this respect, the waveguide can effect a dual function of filtering and signal transmission of the output signal 9 and/or the received signal 44.

It is preferred that the frequency generator arrangement 1 or the frequency multiplier 7 of the radar receiver 42, which can be controlled with the control input 13, can be controlled or switched off in such a way as to prevent any coupling of the local oscillator signal formed by the output signal 9 via the mixer 3 into the antenna 39. Advantageously, this can prevent the emission of any interference when the mixer 43 is not being operated.

In another aspect, the present invention relates to a radar system 47 comprising a radar transmitter 38 and a radar receiver 42, at least one of which comprises the frequency generator arrangement 1 as proposed. Furthermore, the radar system 47 preferably comprises at least one radar antenna 39, in particular separate radar antennas 39 for the radar transmitter 38 and the radar receiver 42.

The (respective) radar antenna 39 may be coupled or couplable and/or connected to the radar transmitter 38, so that the output signal 9 is emittable by means of the radar antenna 39, i.e. may be transmitted. Alternatively or additionally, the radar antenna 39 is coupled or couplable and/or connected to the radar receiver 42, so that a received signal 44 receivable by means of the radar antenna 39 can be convertible with the mixer 43 with respect to its frequency.

In principle, it is possible for the radar system 47 to have multiple radar receivers 42 and/or radar transmitters 38. In this respect, the radar system 47 may be a MIMO radar system 41 with multiple inputs and/or outputs.

Further, the present invention has been described with reference to a, particularly preferably dual, frequency multiplier 7 having (exactly) one frequency multiplier core. In principle, however, it is possible and preferred that the frequency multiplier 7 comprises several, in particular successively connected or cascaded frequency multiplier stages, each of which comprises a frequency multiplier core 11. In this case, each frequency multiplier core 11 can effect a multiplication by a certain factor, for example, so that the frequency multiplier 7 can realize a corresponding multiplication factor on the basis of a plurality of stages, for example a quadrupling in the case of two cascaded multiplier stages in total or an eightfold increase in the oscillator frequency fo in the case of three cascaded multiplier stages in total in order to form the output signal 9 with the multiplier frequency fv.

In this case, it is basically sufficient if one of the stages, in particular the last stage or only one of the frequency multiplier cores 11, in particular the frequency multiplier core 11 directly connected to the multiplier output 10, comprises the power supply 12 with the control input 13. Alternatively or additionally, however, several or all of the frequency multiplier cores 11 may be provided with the power supply 12 and/or the control input 13.

Another aspect of the present invention relates to the use of the frequency multiplier 7 of a frequency generator arrangement 1, comprising the oscillator 2 coupled and/or connected on the output side to the input 8 of the frequency multiplier 7, for controlling the multiplier output power Pv of the output signal 9 of the frequency generator arrangement 1.

In this context, it is preferred that the multiplier output power is controlled or regulated during operation, in particular as a function of an operating mode of a radar system 47 and/or as a function of the detection of an existing or impending interference 16 or collision with external signals 17 and/or for masking out certain time intervals 15 and/or frequency ranges, in particular those which cannot or may not be used in the immediate application environment.

The oscillator 2 is preferably designed to generate oscillator frequencies fo in the millimeter wave range and/or of at least 30 GHz and/or at most 1 THz, preferably at most 500 GHz, in particular at most 300 GHz. Preferably, it is suitable for generating frequencies between 60 GHz and 90 GHz. Preferably, the multiplier frequency fv is also in the millimeter wave range, i.e., between 30 GHz and 300 GHz. With a preferred multiplication by a factor of two, the multiplier frequency fv is between 120 GHz and 180 GHz in the example.

The power control 14 is preferably designed to reduce the output power Pv of the frequency generator arrangement 1 in a start-up phase and/or in a shut-down phase of the frequency generator arrangement 1, the oscillator 2 and/or a control associated with the oscillator 2 by controlling the power supply 12 of the frequency multiplier core 11.

In particular, the power control 14 is adapted to reduce the output power Pv of the frequency generator arrangement 1 by controlling the power supply 12 of the frequency multiplier core 11 when the oscillator 2 settles or when a control of the oscillator frequency fo has not yet reached a steady state or has left the steady state. In this way, the emission of interference can be avoided.

The frequency generator arrangement 1 may include a control loop 48 for controlling the output power Pv of the output signal 9 to a reference variable 49 by controlling the power supply 12 of the frequency multiplier core 11. The control loop 48 is indicated in FIG. 1.

The reference variable 49 can be a fixed value or predetermined curve specified over the multiplier frequency fv, oscillator frequency fo and/or time. FIG. 1 symbolically shows a reference variable over the time The frequency generator arrangement 1 may comprise a power meter 50 for measuring the output power Pv of the output signal 9. The power meter 50 is preferably coupled and/or connected directly or indirectly, in particular via a filter 40 and/or an amplifier 41, to the output 10 of the frequency multiplier 7 and/or the frequency multiplier core 11. Accordingly, the power meter 50 determines a power value or a measured quantity corresponding thereto as measured output power Pv. The power meter 50 is schematically shown in FIG. 1 at different possible positions in dashed form, but is generally implemented only once and can also be provided at another position at which the output power Pv can be determined.

If several frequency multipliers 7 are provided, several control circuits 48 can also be used or provided for their control, even if only one control circuit 48 is shown in FIG. 1. Furthermore, the frequency multiplier 7 of the receive path or radar receiver 42 can also be controlled or regulated, even if no control input 13 is drawn in FIG. 1 for clarity. In this case, the output powers Pv of the frequency multipliers 7 can be controlled or regulated separately.

Preferably, the control circuit 48 comprises a controller 51 adapted to compare the measured output power Pv with the reference variable 49 and, by controlling the power supply 12 of the frequency multiplier core 11, to adjust the output power Pv to the reference variable 49. In particular, the controller 51 forms the difference between the measured output power Pv and the reference variable 49 and generates the control signal VCTRL on the basis of this difference, with which the output power Pv is adjusted accordingly, so that the difference is compensated or at least substantially regulated to zero.

The power control 14 may be a part of the controller 51. Here, the controller 51 can use the power control 14 to control the power supply 12 on the basis of the difference. The power control 14 can alternatively or additionally, in particular temporarily or in the intervals 15 override the control or influence it by adjusting the reference variable 49, in particular so that the output power Pv is reduced and/or can be reduced.

In particular, the output power Pv of the output signal 9, when it is in the form of a/the radar signal, preferably a/the FMCW signal 22, in particular a/the frequency ramp 23, can be controlled by the control loop 48 preferably to the reference variable 49, in particular the fixed value. In this way, fluctuations of the output power Pv over the frequency, which are generally more or less unavoidable and disturbing due to undesirable effects of the electrical components used, can be compensated.

The output power Pv is preferably equal to or corresponds to the amplitude of the output signal 9. The power meter 50 is also called (RF) PWR detector. It can be designed as a voltage or voltage amplitude detector, since corresponding values at a given reference resistance correspond to the output power Pv or can be converted into it. On this basis, in other words, the power or the (voltage) amplitude of the output signal 9 can be controlled to a constant value during the generation of the FMCW ramp (as output signal 9). For this purpose, the PWR detector can control the frequency multiplier 7, in particular the frequency doubler, in order to adjust the amplitude response of the output signal 9 during the generation or the course of the FMCW ramp.

Further, the present invention relates to a method for controlling the output power Pv of an output signal 9 of a frequency generator arrangement 1 comprising a frequency multiplier 7 and an oscillator 3 which is coupled and/or connected on the output side to an input 8 of the frequency multiplier 7 for generating an output signal 9 of the frequency generator arrangement 1 with a multiplier frequency fv corresponding to a multiple of the oscillator frequency fo, wherein the frequency multiplier 7 comprises a frequency multiplier core 11 directly causative of the frequency multiplication, wherein the frequency multiplier core 11 comprises a power supply 12, and wherein the frequency generator arrangement 1 comprises a control input 13 for controlling the power supply 12 of the frequency multiplier core 11, whereby an output power Pv of the output signal 9 is adjusted by controlling the power supply 12 of the frequency multiplier core 11.

Preferably, the power supply is controlled by operating the frequency generator arrangement 1 and its components in the manner described, whereby corresponding advantages and characteristics can be achieved.

The aspects of the present invention may be realized separately and/or combined in various ways to produce synergistic effects, although this is not explicitly explained in each case.

LIST OF REFERENCE SIGNS

1 Frequency generator arrangement
2 Oscillator
3 Oscillator signal
4 Oscillator output
5 Oscillator control input
6 PLL
7. Frequency multiplier
8. Multiplier input
9. output signal
10 Multiplier output
11 Frequency multiplier core
12 Energy supply
13 Control input
14 Power control
15 Interval
16 Interference
17 external signal 18 Interference detector
19 Oscillator control
20 Reference
21 Frequency gradient
22 FMCW signal
23 Frequency ramp
24 Current source
25 Current mirror circuit
26 Reference transistor
27 Current mirror
28 Reference transistor
29 Resistance (reference current)
30 Control transistor
31 Control transistor
32 Load
33 First difference stage
34 Second difference stage
35 Coupling network
36 Capacitor
37 Waveguide
38 Radar transmitter
39 Radar antenna
40 Filter
41 Power amplifier
42 Radar receiver
43 Mixer
44 Receive signal
45 Signal input
46 Control input
47 Radar system
48 Control loop
49 Reference variable
50 Power meter
51 Controller
fo Oscillator frequency
Po Oscillator output power
fv Multiplier frequency
Pv Multiplier output power
Iv Core current
Us Control voltage

The invention claimed is:

1. A frequency generator arrangement comprising:
an oscillator configured to generate an oscillator signal having an oscillator frequency and an oscillator output configured to output the oscillator signal, wherein the frequency generator arrangement further comprises a frequency multiplier coupled or connected to the oscillator output and configured to generate an output signal of the frequency generator arrangement with a multiplier frequency corresponding to a multiple of the oscillator frequency,
wherein the frequency multiplier comprises a frequency multiplier core directly causative of the frequency multiplication, the frequency multiplier core having a power supply, and wherein the frequency generator arrangement comprises a control input configured to control the power supply of the frequency multiplier core, whereby an output power of the output signal is adjustable by controlling the power supply of the frequency multiplier core,
wherein the frequency generator arrangement comprises a power control which is coupled or connected to the control input and is configured to reduce or switch off the output power of die output signal of die frequency generator arrangement by controlling the power supply of the frequency multiplier core in at least one time interval or frequency range of the output signal, while the oscillator continues to generate the oscillator signal, and
wherein the power control is configured to reduce the output power of the frequency generator arrangement in a start-up phase or in a switch-off phase of the frequency generator arrangement, of the oscillator, or of a control associated with the oscillator, by controlling the power supply of the frequency multiplier core.

2. The frequency generator arrangement according to claim 1, wherein the frequency generator arrangement comprises a power control which is coupled or connected to the control input and is configured to reduce or switch off the output power of the output signal of the frequency generator arrangement by controlling the power supply of the frequency multiplier core in at least one time interval or frequency range of the output signal, while the oscillator continues to generate the oscillator signal.

3. The frequency generator arrangement according to claim 2, wherein the power control is configured to reduce the output power of the frequency generator arrangement in the interval or frequency range in order to avoid interference or collision with an external signal such that the interference or collision with the external signal is avoided.

4. The frequency generator arrangement according to claim 1, wherein the power control is configured to reduce the output power of the frequency generator arrangement, or to switch it off at least substantially, by controlling the power supply of the frequency multiplier core when the oscillator oscillates or while a control of the oscillator frequency has not yet reached a steady state or has left the steady state.

5. A frequency generator arrangement comprising:
an oscillator configured to generate an oscillator signal having an oscillator frequency and an oscillator output configured to output the oscillator signal, wherein the frequency generator arrangement further comprises a frequency multiplier coupled or connected to the oscillator output and configured to generate an output signal of the frequency generator arrangement with a multiplier frequency corresponding to a multiple of the oscillator frequency,
wherein the frequency multiplier comprises a frequency multiplier core directly causative of the frequency multiplication, the frequency multiplier core having a power supply, and wherein the frequency generator arrangement comprises a control input configured to control the power supply of the frequency multiplier core, whereby an output power of the output signal is adjustable by controlling the power supply of the frequency multiplier core,
wherein the frequency generator arrangement further comprises an oscillator control which is configured to control the oscillator to generate one or more of: radar signals, FMCW signals, and frequency ramps.

6. The frequency generator arrangement according to claim 5, wherein the frequency generator arrangement is configured to reduce or at least substantially switch off the output power of the radar signal in a time interval without influencing the oscillator control or the shape of the radar signal generated by the oscillator.

7. The frequency generator arrangement according to claim 6, wherein the radar signals are or have frequency ramps and the interval extends over less than 50% and the output signal outside the interval comprises an at least substantially continuous frequency characteristic or constant frequency gradient or constant output power.

8. A frequency generator arrangement comprising:
an oscillator configured to generate an oscillator signal having an oscillator frequency and an oscillator output configured to output the oscillator signal, wherein the frequency generator arrangement further comprises a frequency multiplier coupled or connected to the oscillator output and configured to generate an output signal of the frequency generator arrangement with a multiplier frequency corresponding to a multiple of the oscillator frequency,
wherein the frequency multiplier comprises a frequency multiplier core directly causative of the frequency multiplication, the frequency multiplier core having a power supply, and wherein the frequency generator arrangement comprises a control input configured to control the power supply of the frequency multiplier core, whereby an output power of the output signal is adjustable by controlling the power supply of the frequency multiplier core,
wherein the frequency generator arrangement comprises a control loop configured to control the output power of the output signal to a reference variable by controlling the power supply of the frequency multiplier core.

9. The frequency generator arrangement according to claim 8, wherein the frequency generator arrangement comprises a power meter for measuring the output power of the output signal and the control circuit comprises a controller which is designed to compare the measured output power with the reference variable and to control the output power to a reference variable by controlling the power supply of the frequency multiplier core.

10. The frequency generator arrangement according to claim 1, wherein the power supply is or comprises a current mirror circuit coupled or connected to the control input which can be controlled via the control input.

11. A frequency generator arrangement comprising:
an oscillator configured to generate an oscillator signal having an oscillator frequency and an oscillator output configured to output the oscillator signal, wherein the frequency generator arrangement further comprises a frequency multiplier coupled or connected to the oscillator output and configured to generate an output signal of the frequency generator arrangement with a multiplier frequency corresponding to a multiple of the oscillator frequency,
wherein the frequency multiplier comprises a frequency multiplier core directly causative of the frequency multiplication, the frequency multiplier core having a power supply, and wherein the frequency generator arrangement comprises a control input configured to control the power supply of the frequency multiplier core, whereby an output power of the output signal is adjustable by controlling the power supply of the frequency multiplier core,
wherein the frequency generator arrangement comprises a filter, separate from the frequency multiplier or realized with one or more oscillating circuits or waveguides, so that the oscillator frequency in the output signal is suppressed or can be suppressed.

12. A radar transmitter comprising:
a frequency generator arrangement comprising an oscillator configured to generate an oscillator signal having an oscillator frequency and an oscillator output configured to output the oscillator signal, wherein the frequency generator arrangement further comprises a frequency multiplier coupled or connected to the oscillator output configured to generate an output signal of the frequency generator arrangement with a multiplier frequency corresponding to a multiple of the oscillator frequency,
wherein the frequency multiplier comprises a frequency multiplier core directly causative of the frequency multiplication, the frequency multiplier core having a power supply, and wherein the frequency generator arrangement comprises a control input configured to control the power supply of the frequency multiplier core, wherein an output power of the output signal is adjustable by controlling the power supply of the frequency multiplier core,
and wherein the radar system comprises at least one radar antenna, wherein the radar antenna or one of the radar antennas is coupled or couplable or connected to a radar transmitter of the radar system, so that the output signal can be emitted the radar antennas, or wherein the radar antenna or another one of the radar antennas is coupled or couplable or connected to a radar receiver of the radar system, so that a received signal received or receivable with the radar antenna or with the other of the radar antennas can be converted in its frequency with a mixer mixing the received signal with the output signal.

13. A method to control an output power of an output signal of a frequency generator arrangement comprising a frequency multiplier and an oscillator which is coupled or connected on the output side to an input of the frequency multiplier and configured to generate an output signal of the frequency generator arrangement with a multiplier frequency corresponding to a multiple of the oscillator frequency,
wherein the frequency multiplier comprises a frequency multiplier core directly causative of the frequency multiplication, the frequency multiplier core having a power supply, and wherein the frequency generator arrangement comprises a control input for controlling the power supply of the frequency multiplier core, whereby an output power of the output signal is controlled by controlling the power supply of the frequency multiplier core, and
wherein radar signals, FMCW signals, or frequency ramps, are generated by controlling the oscillator.

14. The method according to claim 13, wherein the output power of the output signal is changed, reduced or regulated, by controlling the power supply of the frequency multiplier core, while the oscillator continues to generate the oscillator signal.

15. The method according to claim 13, wherein the power supply is controlled such that the frequency multiplier core within the output signal in at least one interval or frequency range reduces the output power of the output signal of the frequency generator arrangement, or at least substantially switches off, while the oscillator continues to generate the oscillator signal.

16. The method according to claim 13, wherein by controlling the power supply of the frequency multiplier core, the output power of the frequency generator arrangement is reduced or at least substantially switched off, in a startup phase or in a switch-off phase of the frequency generator arrangement, of the oscillator or of a control associated with the oscillator.

17. The method according to claim 13, wherein the output power of the radar signal is reduced in a time interval, or at least substantially switched off, without influencing the oscillator control or the shape of the radar signal generated by the oscillator.

18. The method according to claim 17, wherein the output signal outside the interval comprises an at least substantially continuous frequency characteristic or constant frequency gradient, with at least substantially constant output power.

* * * * *